US009928938B2

United States Patent
Fasnacht et al.

(10) Patent No.: US 9,928,938 B2
(45) Date of Patent: Mar. 27, 2018

(54) PARASITIC BATTERY DRAIN TEST ASSEMBLY FOR MULTIPLE COMPONENT VEHICLE CIRCUITRY ANALYSIS

(71) Applicant: Lisle Corporation, Clarinda, IA (US)

(72) Inventors: Christopher L. Fasnacht, Clarinda, IA (US); Philip E. Sunderman, Villisca, IA (US)

(73) Assignee: LISLE CORPORATION, Clarinda, IA (US)

( * ) Notice: Subject to any disclaimer, the term of this patent is extended or adjusted under 35 U.S.C. 154(b) by 198 days.

(21) Appl. No.: 15/016,657

(22) Filed: Feb. 5, 2016

(65) Prior Publication Data

US 2016/0231370 A1    Aug. 11, 2016

Related U.S. Application Data

(60) Provisional application No. 62/114,292, filed on Feb. 10, 2015.

(51) Int. Cl.
| | |
|---|---|
| G01N 27/416 | (2006.01) |
| H01B 7/00 | (2006.01) |
| G01R 31/02 | (2006.01) |
| H02J 7/00 | (2006.01) |
| G01R 15/12 | (2006.01) |
| G01R 31/36 | (2006.01) |
| G01R 31/00 | (2006.01) |

(52) U.S. Cl.
CPC .......... *H01B 7/0045* (2013.01); *G01R 31/025* (2013.01); *H02J 7/0029* (2013.01); *G01R 15/12* (2013.01); *G01R 31/007* (2013.01); *G01R 31/3696* (2013.01)

(58) Field of Classification Search
CPC ................................. H02J 7/355; H02J 7/0008
USPC ......... 320/104, 105, 111, 114; 324/426, 427, 324/433, 434, 435, 437
See application file for complete search history.

(56) References Cited

U.S. PATENT DOCUMENTS

| 6,441,586 B1 | 8/2002 | Tate, Jr. et al. |
| 6,526,361 B1 | 2/2003 | Jones et al. |

(Continued)

OTHER PUBLICATIONS

Motor: "Drawing to a Close": Feb. 2011.

(Continued)

*Primary Examiner* — Edward Tso
(74) *Attorney, Agent, or Firm* — Banner & Witcoff, Ltd.

(57) ABSTRACT

A cable harness assembly useful in combination with a current measurement device includes first and second pairs of cables each pair having a lead connected to a separate pole of a bypass switch, each pair including one of said cables fused, said first pair of cables having leads connectable to a current measurement device and the second pair of cables connectable to direct current electric power course which is incorporated with circuitry involving various control and other modules potentially susceptible to parasitic current drain. The first and second pair of cables each includes one cable fused, the fuse rating of a second pair rated higher than said first pair rating, the first pair having leads configured connect to a current measurement device and the second pair having leads connectable respectively to the direct current power source and a circuit powered by the power source.

8 Claims, 2 Drawing Sheets

(56) References Cited

U.S. PATENT DOCUMENTS

| | | | |
|---|---|---|---|
| 6,570,385 B1* | 5/2003 | Roberts | G01R 31/007 320/104 |
| 7,409,856 B2 | 8/2008 | Brott et al. | |
| 7,725,275 B2 | 5/2010 | Zhang et al. | |
| 7,761,389 B2 | 7/2010 | Medasani et al. | |
| 8,209,082 B2 | 6/2012 | Miller et al. | |
| 8,818,617 B2 | 8/2014 | Miller et al. | |
| 2004/0054503 A1* | 3/2004 | Namaky | G01R 31/007 702/183 |
| 2006/0214508 A1 | 9/2006 | Binder | |

OTHER PUBLICATIONS

Motor: "Circling the Drain": Jan. 2011.
Motor: "Tracking Down the Drain": Dec. 2010.
OTC 7645 Parasitic Draw Tester, http://www.amazon.com/OTC-7645-Parasitic-Draw-Tester/dp/B000RT81XW dated Jun. 19, 2014.
Thexton 431 Parasitic Battery Draw Test Adapter, http//www.autotoolworld.com/Thexton-431-Parasitic-Battery-Draw-Test-Adapter_p_18169 . . . dated 2/4/216.
OTC Battery Tester, Digital, Automotive, Model No. 3183, https://www.grainger.com/product/OTC-Battery-Tester-1JYR1 dated Feb. 4, 2016.
Matco Tools TH209 Professional Circuit and Parasitic Drain Tester, http://www.vehicleservicepros.com/product/10909501/matco-tools-th209-professional-cir . . . dated Jun. 19, 2014.

\* cited by examiner

PARASITIC BATTERY DRAIN TEST ASSEMBLY FOR MULTIPLE COMPONENT VEHICLE CIRCUITRY ANALYSIS

CROSS REFERENCE TO RELATED APPLICATION

This is a utility application claiming priority to provisional application, Ser. No. 62/114,292 filed Feb. 10, 2015.

BACKGROUND OF THE INVENTION

In a principal aspect the present invention comprises a parasitic battery drain test assembly incorporating a current measuring device such as a multimeter or amp meter and a wiring harness which enables determination of the parasitic current drain associated with an electrical system of a mechanized device such as a motor vehicle.

Modern motor vehicles include complex electronic circuitry and computer control modules designed to provide power to sensors, the vehicle ignition system, and multiple other electrically powered components including various monitoring systems, safety systems and the like. The power to operate these systems is typically sourced from the vehicle battery that is charged, as needed, by operation of the vehicle engine. However, when the vehicle engine is not continuously operated, the battery may drain with the passage of time and preclude ignition and operation of the vehicle engine and electrically powered components.

The decline of battery power or charge is colloquially termed parasitic drain. Parasitic drain results when the vehicle engine and electrically powered elements or components are shut down or turned off. That is, the various modules and components operated by electric power in the vehicle will continue to draw power from the battery over a period of time, typically up to thirty minutes subsequent to termination of operation of the vehicle engine and initiation of the sleep mode of various control and sensing modules. Generally, the draw on the electric power source, e.g., battery, should be minimized when the vehicle is not in use. However, if a component or control module is faulty, excess drain of accessible power (parasitic drain) from the battery may result. This issue is discussed at length in various articles of Motor magazine including the February 2011 issue beginning at page 4, the December 2010 issue beginning at page 6, as well as the January 2011 issue beginning at page 6.

Methods and devices have been proposed for determination of the amount of parasitic drain or loss of battery power as well as the source or origin of the drain when the vehicle is not in service. For example, the following patents provide some guidance in this regard.

| PAT./PUB. NO. | ISSUE/PUB. DATE | TITLE |
|---|---|---|
| 2006/0214508 | Sep. 28, 2006 | Vehicle Battery Protection Device |
| 6,441,586 | Aug. 27, 2002 | State of Charge Prediction Method and Apparatus for a Battery |
| 6,526,361 | Feb. 25, 2003 | Battery Testing and Classification |
| 7,409,856 | Aug. 12, 2008 | Starting Motor Tester that Measures Power |
| 7,725,275 | May 25, 2010 | Telematics-Based Method and System of Battery Parasitic Load Validation for a Vehicle Fleet |
| 7,761,389 | Jul. 20, 2010 | Method for Anomaly Prediction of Battery Parasitic Load |
| 8,209,082 | Jun. 26, 2012 | Method and Apparatus for Monitoring Battery Drain and Starter Current |
| 8,818,617 | Aug. 26, 2014 | Method and Apparatus for Monitoring Battery Drain and Starter Current |

Also, commercial products have been made available directed to the determination of parasitic drain including the following: OTC, Parasitic Draw Tester Product No. 7645, Thexton Product No. 431 Battery Parasitic Drain Test Adapter, OTC 3183 Digital Battery Tester, and Mateo Tools, Product TH209 Professional Circuit and Parasitic Drain Tester.

While these diagnostic methods, tools and devices may provide a system capable of eliciting important diagnostic information for an auto mechanic, the need remains for an improved and cost effective way to provide for the identity of the existence and degree of parasitic drain in motor vehicles and in other battery powered devices, particularly those which operate intermittently and which include a myriad of electrical components and modules provided to enhance the operation of the apparatus or device, such as a vehicle.

SUMMARY OF THE INVENTION

Briefly, the present invention comprises a harness assembly capable of utility in combination with a multimeter, particularly a multimeter of the type which measures amperage or current. The cable harness assembly includes a first assembly component comprised of first and second conductive cables. Each cable of the first assembly component includes one end contact or lead that is connectable to a compatible contact socket of a multimeter or an ammeter or current measurement device. An opposite end lead of the first and second poles of the first assembly cables are connected, respectively, to separate poles of a two pole on/off or bypass switch. One of the first and second cables to the multimeter is fused.

A second cable assembly component comprises a pair of conductive cables, each of which includes opposite end leads that connect, respectively, from the poles of the on/off or bypass switch to first and second contact connecting elements, such as alligator clips which are connectable respectively to one battery post of a vehicle and a battery cable that has been detached from the battery post of the vehicle from which the cable has been removed. One of these first and second cables of the second cable assembly component is fused.

The bypass switch, when open, provides a series circuit between a multimeter (current measuring device) and the vehicle disconnected battery cable and open pole contact. When the bypass switch is closed, a parallel circuit to the current measuring device (multimeter) is maintained. The fuse of the first assembly component is set or rated at a lower level than the fuse of the second assembly component to provide protection to the multimeter or current measuring device.

To evaluate parasitic drain from an electrical system of a vehicle, the leads from the first cable assembly component are coupled to the appropriate sockets of a current measurement device or meter. The on/off or bypass switch is initially maintained in the closed or "on" position and one of the battery cables is removed from its battery post after the vehicle engine is turned "off" and all vehicle components, such as lights and radio, are in the "off" condition and vehicle doors are closed. Then one of the leads or clips of the second assembly component is connected to an open post of the vehicle battery from which the battery cable has been removed. The other contact or clip of the second cable assembly component is next connected to the detached vehicle battery cable. If the current exceeds the fuse rating of the second assembly component, the circuit will be broken indicating excessive battery drain.

Because the current sensing device is to be set on a scale which measures low amperage, the fuses in the circuitry protect the sensing or current measurement meter when the switch is either in the "on" or "off" position. That is, when the vehicle engine is initially turned off, the bypass switch will be "on" or in the closed position and thus the higher rated fuse will sense battery load or drain. If the drain or load is in excess of the fuse rating, the circuit will be broken and will protect the multimeter which has not yet been placed in a circuit to the battery. If the fuse of the second assembly does not "blow", then the multimeter will sense current when the bypass switch is opened or turned to the "off" position. That is, the circuit to and including the multimeter will be closed. Thus, initial current or power consumption readings will be representative of the initial powering down of vehicle components as the current sensing and measurement device is completed. As the automotive modules enter a sleep mode, the power consumption or current readings should decline assuming there is minimal parasitic drain of power. The bypass switch can then remain in the "off" position and all parasitic load current will safely flow through the multimeter or ammeter for continued analysis. Also, since the first assembly component is fused, the current sensing device will be protected from a sudden current drain spike or event.

Thus, when the first and second assembly components of cables and the multimeter or current measurement device are attached as described, the initial readings observed may typically exceed 50 milliamps. Once the computer components of the vehicle power down, these readings should drop to the vicinity of 30 milliamps or less in modern vehicles. This drop may take anywhere from five to thirty minutes and perhaps up to sixty minutes.

A skilled technician will thus be enabled to evaluate the degree of decline and whether there is undue current or parasitic drain after a reasonable time frame indicating a likely failure in a circuit or component powered by the battery. Observing current drain may thereby be determined over a time period when all of the powered components of the vehicle are "off" and substantially powered down or in a "sleep" mode.

Typically, the second assembly of paired cables, connected to one of the battery posts and a disconnected battery cable, are fused for higher amperage than the fused cable associated with the first assembly of paired cables that are connected to the multimeter or current measurement device. For example, the fuse in a cable connected to the battery post may be a ten (10) amp fuse or less and a fuse in one of the cables to the multimeter will be a seven and one half (7.5) amp fuse or less. With the on/off or bypass switch "on" (i.e., the switch closed), the parasitic drain tester provides a direct current path between the cables attached to a vacant battery post and a disconnected battery cable disconnected from that post. If the current flow through the cables connecting the battery post and a disconnected battery cable exceeds ten amps, then the fuse blows and the bypass switch is protected from possible damage.

On the other hand, when the switch is in the "off" or open position, the current flow is directed through the multimeter or ammeter. In this position, the current flow to the multimeter or ammeter is monitored by the 7.5 amp fuse. If the current exceeds the 7.5 amp fuse, the fuse will "blow" protecting the internal fusing in the multimeter. Therefore, the ammeter or multimeter will be protected and may safely detect currents less than 7.5 amps. This is an objective of the combination and will provide readings continuously measuring the drain through the system as determined by the multimeter or ammeter or current measurement device.

Thus, it is an object and aspect of the invention to provide a quick method to check current draw from a car battery when the vehicle associated with the battery is turned "off".

A further object and aspect of the invention is to provide a means to utilize a typical multimeter or ammeter to provide for measurement of parasitic drain without exposing the multimeter to excessive current and without an expensive circuit breaker incorporated into the multimeter as part of the design thereof. Thus, a safety factor is included in the design of the disclosed assembly to protect the multimeter while at the same time enabling collection of data relating to parasitic drain.

Yet another object and feature of the invention is to provide an assembly or kit incorporating a standard multimeter or ammeter which enables the measurement, over time, of parasitic drain from a motor vehicle incorporating multiple components which are programmed to enter a "sleep" mode following termination of the ignition of the motor vehicle and the electric powered components.

Another object of the invention is to provide a tool of component parts which may comprise a kit including a wiring harness assembly and a current sensing and measurement device which measure parasitic drain readings over time without excessive supervision by a mechanic or technician thereby enabling the mechanic or technician to perform service on the vehicle while securing the parasitic drain readings.

These and other objects, advantages and features of the invention are set forth in a detailed description which follows.

BRIEF DESCRIPTION OF THE DRAWING

In the detailed description which follows, reference will be made to the drawing comprised of the following figures and photographs.

DESCRIPTION OF AN EMBODIMENT OF THE INVENTION

Figure 1:
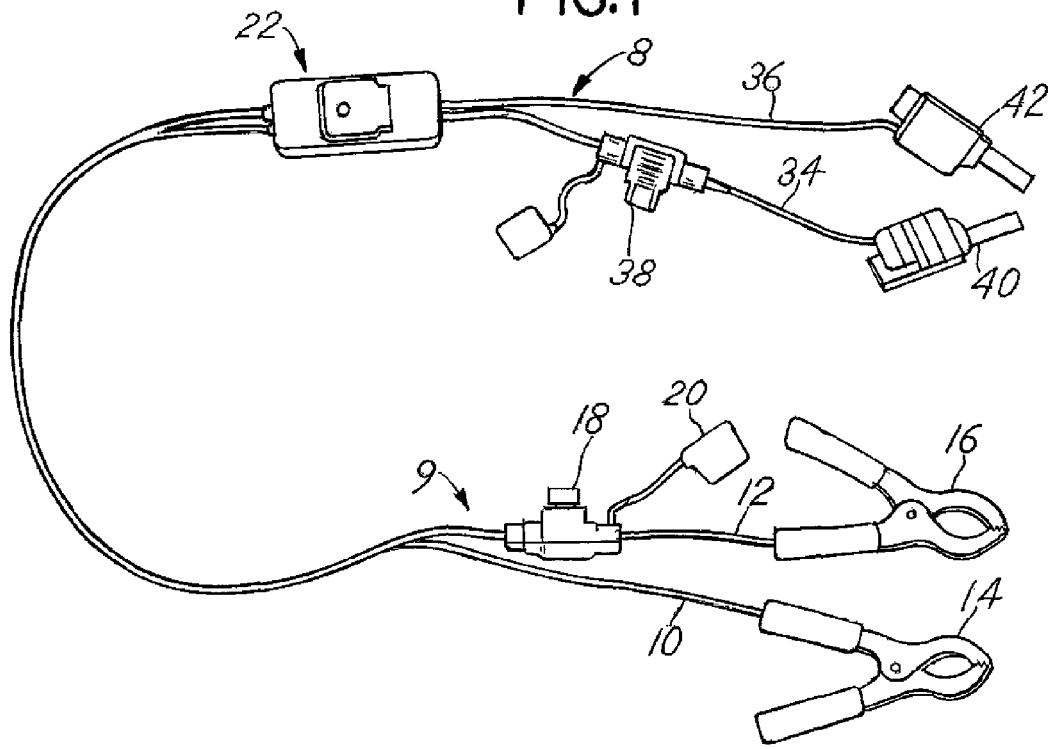
FIG. 1 is a perspective view of the harness assembly utilized in the practice of the invention.

FIG. 1 depicts a wiring harness assembly which may be manufactured and sold separately from a current measurement device such as a multimeter or an ammeter. Thus, the harness assembly of FIG. 1 includes the benefit of a low cost assembly that may be used with a standard diagnostic tool available to and maintained by many technicians and mechanics. The combination of such elements results in the utilization of a very straightforward, simple and useful harness construction or assembly with a current measurement device that has multiple uses. Because of the design for the harness assembly, the current measurement device is subject to protection when utilized to determine parasitic drain. The harness depicted in FIG. 1 may thus be combined with a current sensing and measurement device to provide a kit for measurement of parasitic current drain.

Figure 2:
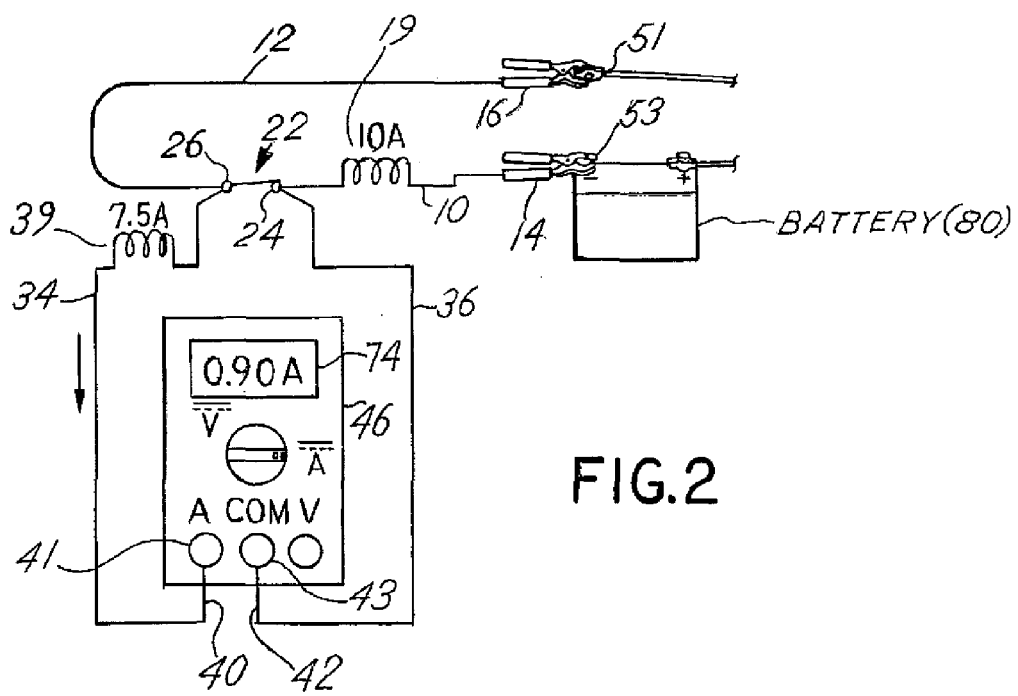
FIG. 2 is a schematic drawing depicting an initial step in the utilization of the harness assembly of FIG. 1.

Referring to FIG. 1 and FIG. 2, the harness assembly includes a first assembly component 8 comprising a first pair of conductive cables or wires 36 and 34 attached to the two pole bypass switch 22 having pole terminal 24 and pole terminal 26, respectively, of the rocker or bypass switch 22. The cable 34 attached to pole 26 includes a fuse block 38 which incorporates a removable and replaceable fuse 39 having an amperage limit, such as seven and one half (7.5) amps. The cables 34 and 36 include opposite end lead connectors or leads 40 and 42 which are designed to fit into ammeter sockets or connections 41, 43, respectively, of a multimeter or typical current measurement device 46. If a multimeter is utilized, the sockets comprise a common (COM) socket 43 and an amperage (A) socket 41.

The harness assembly further includes a second assembly component 9 including a first cable 10 and a second cable or conductive cable wire 12 joined to lead elements or contacts such as alligator clips 14 and 16, respectively. One of the cables 12 includes a fuse block 18 with a replaceable fuse 19. The fuse block 18 typically has a cap 20, as does block 38. The size or amperage load of the fuse 19 in the fuse block 18 typically will be in the range of about ten (10) amps and in a preferred embodiment is typically higher than the rating of fuse 39. Opposite ends of cables 10, 12 are attached to the throw terminal 24 and the pole terminal 26, respectively, of bypass switch 22.

Bypass switch 22 provides a means of directing the current flow through the cables 10 and 12. Current flow may be directed from pole terminal 26 to throw terminal 24 of the bypass switch 22 when the switch 22 is in the "on" or closed position.

Figure 3:
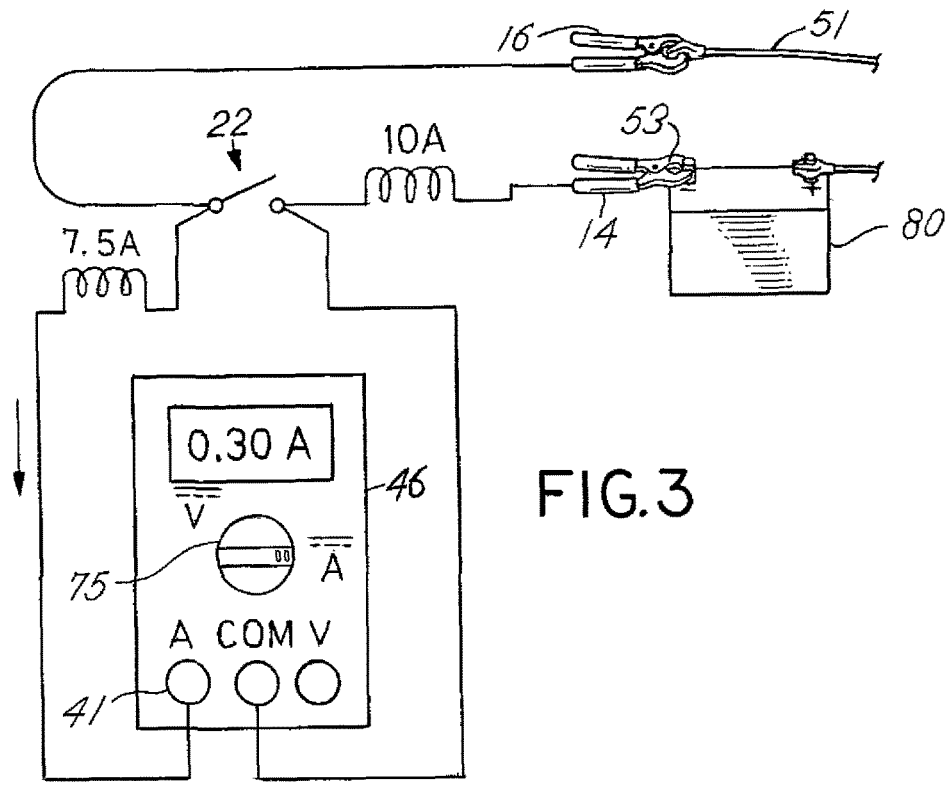
FIG. 3 is a schematic drawing illustrating a further step in the practice of the invention which combines the assembly of FIG. 1 with a multimeter such as an amp meter.
Figure 4:
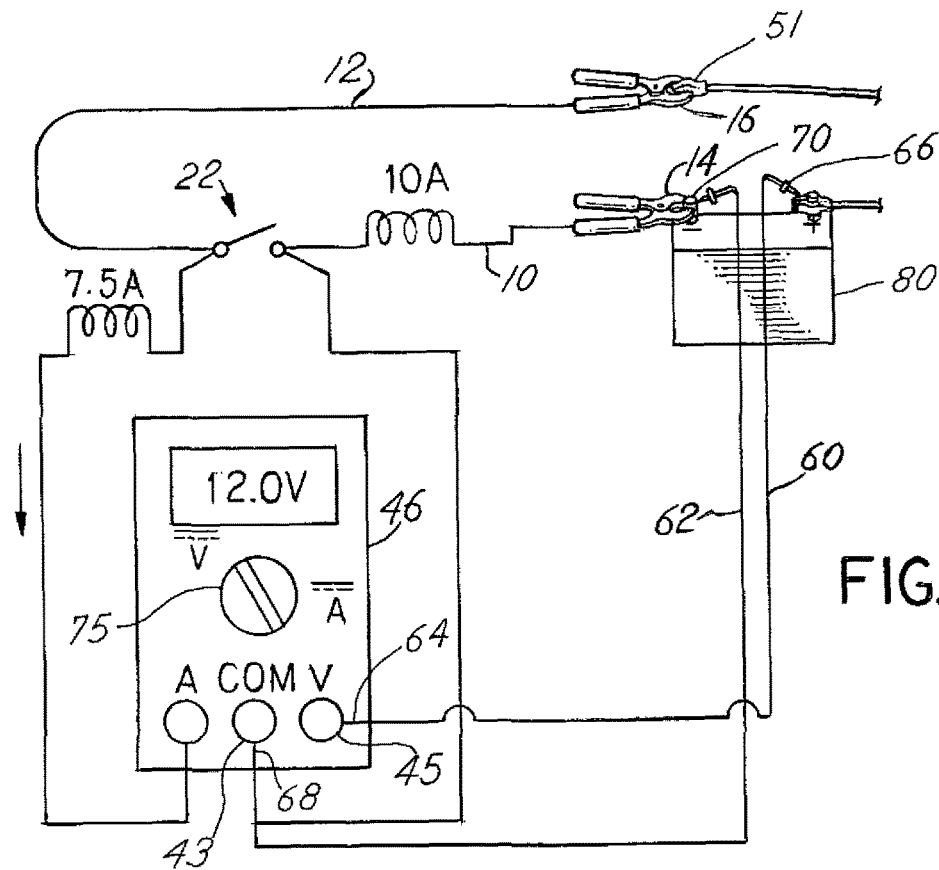
FIG. 4 is a schematic drawing depicting the use of the combination of a volt meter and the cable assembly depicted in FIG. 1.

FIGS. 2-4 depict utilization of a typical multimeter 46 which includes a function selector 75 and connections that enable current measurement via sockets 41, 43. FIG. 2 depicts an initial mode or first step in the utilization of the combination of the multimeter 46 and the cable harness assembly to provide a parasitic drain tester. Specifically, as a first step, one plug of the cable 34, for example, the plug or connection 40, is connected into the amperage socket (A) 41 of the multimeter 46. The other connection lead 42 of cable 36 is connected into the common (COM) socket 43 and the meter 46 is set for reading of DC (direct current) amperage.

As a next step, the motor vehicle ignition is turned to the "off" condition. All blowers, lights and accessories are also turned "off" and the doors of the vehicle are closed. Subsequently, as shown in FIG. 2, either the positive or negative battery cable is removed from a battery post. As a general rule, it is preferred to remove the negative battery cable 51 and use the circuit via connector 16 for parasitic testing. Additionally, this helps the technician avoid accidental shorting of alligator clips to the vehicle chassis or grounded elements. One of the alligator clips 14 or 16 (e.g. 14 as shown) in FIG. 2 is then connected to a battery post 53, (e.g. negative post 53). The bypass switch 22 is placed in the "on" or closed position. Subsequently, the remaining alligator clip, 14 or 16 (e.g. 16) is attached to the removed battery cable 51. After a short interval, on the order of ten seconds, the components in the vehicle associated with the computer operated modules will "wake up". The multimeter 46 is not in the circuit during this step. The components in the vehicle should then enter a "sleep" or minimum power mode.

The next step is illustrated by FIG. 3. That is, the bypass switch 22; namely, switch 22 is turned to the open or "off" position to allow current to flow through the amperage circuit of meter 46 and enable current flow measurement by the meter 46 by the appropriate measurement scale 74 of the meter 46. This current may be observed over time. The initial drain will be in the range of more than 50 milliamps. With time, however, the readings should drop to the vicinity of 30 milliamps or less. This may take five to thirty minutes. If the readings do not drop, then some components in the vehicle circuitry powered by the battery 80 remain on when they were to have been turned off. Alternatively, there may be a defect in a module or component. If the reading goes to zero, then the bypass switch 22 may be damaged or the meter 46 protecting fuse 39 in block 38 may be blown indicating that a high current drain source may still be present.

In any event, the pattern of current drain can be observed by a mechanic or technician and the presence of undesired parasitic drain validated. Subsequently, the mechanic may perform further testing of the on board computer (OBD) or various components to locate the source of undesirable current drain.

FIG. 4 depicts a further aspect of the invention. Specifically, a multimeter 46 capable of voltage as well as amperage measurement may be incorporated with the described cable assembly. Positive voltage probing may be done during a parasitic test. However, the parasitic test in progress must typically utilize the vehicle's negative battery circuit. This is required to avoid short circuiting through the common (black) test lead. Thus, the connectors or leads 14, 16 of the second assembly of cables 9 may include combination banana/alligator connector leads. A separate cable assembly component for voltage measurement comprises cables (test leads) 60, 62, each cable including respectively opposite end lead connectors or leads 64, 66 for cable 60, and leads 68, 70 for cable 62, at their opposite ends. The leads 64, 66, 68, 70 thus comprise connectors. FIG. 4 depicts a lead configuration comprising banana sockets incorporated in alligator clip leads 14, 16 respectively of cables 10, 12 respectively and the sockets in multimeter 46 such as a lead which engages common socket 43 and a separate lead to engage voltage socket 45 of multimeter 46. Setting the multimeter 46 to measure voltage or amperage including evaluation of parasitic drain is thereby enabled by the wiring harness assembly described along with voltage measurement cables.

In summary, the assembly comprising a first cable assembly 8 connectable intermediate a measurement device and a bypass or throw switch 22 further includes a second cable assembly 9 connectable intermediate the bypass switch 22 and a power source (e.g. battery power source). Each cable assembly 8 and 9 is comprised of two cables or wires and each pair of cables or wires includes one of the designated cable or wires to be fused. The first cable assembly 8 includes a wire 34 with a fuse 38 in the assembly 8 that is fused to one of the poles 26 of the bypass switch 22 and the second cable assembly 9 includes one of the wires 12 fused to the opposite or other pole 24 of the bypass switch 22. This arrangement provides safety limits for the monitoring of the current (by way of example) through the second cable assembly 8 from a power source 80 independently from the monitoring of current (by way of example) through the measurement device 46 such as an ammeter. This arrangement is depicted in FIGS. 2 and 3 with respect to measurement of current and the diagram of FIG. 4 illustrates utilization of the cable harness assembly in combination with supplemental cables 60, 62 wherein the bypass switch 22 is open to provide circuitry for the measurement of voltage utilizing the cable harness assembly of the invention.

Various modifications can be made to the assembly without departing from the spirit and scope of the invention. The invention is therefore to be limited only by the following claims and equivalents thereof.

What is claimed is:

1. A cable harness assembly for use in combination with a current measurement device for evaluation of parasitic drain from a direct current source device due to a circuit connection of a component to the direct current source device, said harness assembly comprising:
    a first pair of cables and a second pair of cables;
    a bypass switch including first and second poles and a switch mechanism for connecting and disconnecting said first and second poles;
    each cable of said first pair of cables including first and second opposite end leads wherein said first end leads are connected respectively to said first and second poles of said bypass switch, and said second pair of said end leads are each connectable to a current measurement device, one of said first pair of cables including a fuse assembly intermediate the first and second opposite end leads thereof; and
    each cable of said second pair of cables including first and second opposite end leads wherein said first end leads are connected respectively to said first and second poles of said bypass switch and said second pair of said end leads are connectable respectively to a direct current source device and connectable to a circuit connection of a component connected in series to the direct current source device, one of said second pair of cables including a fuse assembly intermediate the first and second end leads thereof.

2. The harness assembly of claim 1 wherein the fused cable connectable to the current source device has a higher fuse rating than the fused cable connected to the measurement device.

3. The harness assembly of claim 1 in combination with a voltage measuring device.

4. The harness assembly of claim 1 in combination with a multimeter having a direct current terminal, a voltage terminal and a common terminal.

5. The harness assembly of claim 1 wherein the current measurement device and a said circuit connection of a component are in a series circuit with the direct current source device when the bypass switch disconnects the poles.

6. The harness assembly of claim 1 wherein the measurement device and said circuit connection of a component are in parallel with the direct current source device circuits when the bypass switch connects the poles.

7. The assembly of claim 5 wherein the measurement device and a said circuit connection of a component are in parallel circuits with the direct current source device when the bypass switch connects the poles.

8. The assembly of claim 7 wherein the fused cable connectable to the direct current source device has a higher fuse rating than the fused cable connected to the measurement device.

\* \* \* \* \*